United States Patent [19]
Chapman et al.

[11] 3,991,367
[45] Nov. 9, 1976

[54] DETECTION OF POTENTIAL ON HIGH-VOLTAGE TRANSMISSION LINES

[75] Inventors: Byron N. Chapman, Mesa; David A. Hess, Phoenix, both of Ariz.

[73] Assignee: The United States of America as represented by the Secretary of the Interior, Washington, D.C.

[22] Filed: Jan. 20, 1976

[21] Appl. No.: 650,640

[52] U.S. Cl. .................................. 324/133; 324/96; 324/119; 324/120; 324/122; 324/126
[51] Int. Cl.² ............................................ G01R 19/14
[58] Field of Search ............... 324/96, 97, 119, 120, 324/122, 126, 133, 149

[56] References Cited
UNITED STATES PATENTS

| | | | |
|---|---|---|---|
| 3,524,133 | 8/1970 | Arndt | 324/133 X |
| 3,524,178 | 8/1970 | Statton | 324/122 X |
| 3,531,790 | 9/1970 | Staley | 324/133 UX |
| 3,538,440 | 11/1970 | Galloway | 324/126 X |
| 3,660,757 | 5/1972 | Winslow | 324/133 X |
| 3,775,682 | 11/1973 | Ross | 324/122 |

*Primary Examiner*—Stanley T. Krawczewicz
*Attorney, Agent, or Firm*—Thomas Zack; Donald R. Fraser

[57] ABSTRACT

A suspension insulator used on the tower of a high-voltage transmission line has a capacitive voltage dividing pickup plate placed thereon to capacitively pick up a low-power indication of the potential carried by the line. In order to detect the potential on the plate, the potential difference between the plate and the tower is limited, rectified and applied to a neon lamp in a photo coupler. A photosensitive element in the photo coupler responds to the light from the lamp to operate a relay to control remote indicators.

5 Claims, 3 Drawing Figures

DETECTION OF POTENTIAL ON HIGH-VOLTAGE TRANSMISSION LINES

BACKGROUND OF THE INVENTION

1. Field of the Invention

The invention relates to potential detection on a high-voltage line, and particularly to a detection device including a potential-detection plate mounted on a standard suspension insulator.

2. Description of the Prior Art

Computerized supervisory control systems are being installed for use in existing electric power systems everywhere. The most useful supervisory control systems are those designed to indicate the status of the entire power system. Such remote control systems therefore will indicate energized-deenergized status of many substation bus and transmission line sections which presently have no devices to provide this monitoring.

The present method of determining the energized or deenergized condition of the high-voltage power lines using the capacitive voltage divider method is with high-voltage coupling capacitors or capacitive voltage taps in high-voltage bushings of transformers, circuit breakers or other similar pieces of equipment. The present method is somewhat expensive and, therefore, limits the number of coupling capacitors or bushing potential devices to be used on a particular system. Potential transformers and resistance type potential devices are also available, but the costs are still high and permanent additional space and mountings are needed for each device. The coupling capacitor, potential transformer, resistance type potential device, and voltage tap of a high-voltage apparatus bushing all give indication of an energized condition but also are designed to accurately indicate the voltage level of the power line they are attached to, making these devices more expensive than is necessary for a simple potential detector. But simple potential detection is all that is needed to determine if a section of transmission line is operative.

In higher voltage electrical transmission systems, systems such as are described in U.S. Pat. Nos. 3,343,153, 3,390,331, 3,425,049, 3,513,394, 3,656,057 and 3,736,505 are of limited usefulness.

For voltages such as 230-kV, 345-kV, 500-kV, or 750-kV, the use of insulated cable systems is very limited due to adverse inherent electrical characteristics of electrical insulations developed to date. Therefore, capacitive voltage detectors for indication of energized cable as described in these patents would have no application for these higher voltage systems. Also, separation would be accomplished by means of special switches rather than cable-to-transformer connectors as described.

SUMMARY OF THE INVENTION

In the present invention, rather than using conventional devices for potential detection, the design of a standard suspension insulator is modified for use as an inexpensive potential indicator. This insulator potential detector (IPD) can be easily installed at the ground-end of any existing suspension insulator string, on any voltage level, on all transmission lines, and most substation buses, with the same results. The same technique can be applied to post-type, switch-support, or other types of insulators.

The IPD is a modified ten-inch ball and socket suspension insulator which, when used as the "ground-end" insulator of a line or bus suspension insulator string, will detect an energized line or bus. The voltage detection is accomplished by using a capacitance "pick-up" ring or plate attached to the insulator to tap a portion of the voltage distributed across the capacitance of the insulator. The "pick-up" ring provides a high voltage but very low current capacity source which is capable of ionizing the gas and sustaining the glow of a neon lamp.

The IPD, being a modified standard ball and socket suspension insulator, can be added to any existing suspension insulator string and, therefore, does not require construction of mountings or supports nor additional space. The installation, except for the indication wiring, would be no more involved than replacing a bad insulator of an insulator string, which is a routine job for power system crews. This is one of the greatest advantages of the IPD over any other available device. When cost comparisons of purchase, installation, and maintenance are analyzed, the advantage becomes readily apparent.

A detection circuit consisting of a combination rectifier and regulator and a neon lamp photocoupler is connected to the insulator pick-up ring for indication of voltage across the insulator. The photo coupler provides isolation between the IPD supply and a station battery power supply. The photoresistor can be used to operate a relay or solid-state device using the station battery source to provide the line or bus voltage indicaton.

The "Insulator Potential Detector" is not intended to determine a voltage level, but only indicate whether a voltage is present. Indicaton of an energized condition is the only information needed at numerous power system locations for computerized supervisory control system logic. Therefore, the IPD has the advantage of providing a very inexpensive and easy-to-install device for obtaining energized indications by a simple modificaton of the universally-used suspension insulators.

A standard ten-inch suspension insulator has a capacitance of approximately 40 picofarads. The average in-service voltage drop across the insulator is 10 kilovolts AC. The "leakage" current through the insulator is therefore approximately 150 microamperes AC. The current is small due to the high internal impedance of the insulator which is approximately 66 megohms. These values will vary slightly for the standard dimensioned suspension insulators manufactured by different companies. It is not practical to use the low total leakage current for indication as relays or other devices which will operate on this current are not readily available (and there is the additional problem of inserting the measuring circuit between the insulator and ground.) However, by just tapping a portion of the voltage distributed across the insulator, sufficient power is easily obtainable to energize a neon lamp.

DESCRIPTION OF THE PREFERRED EMBODIMENT

Figure 1:
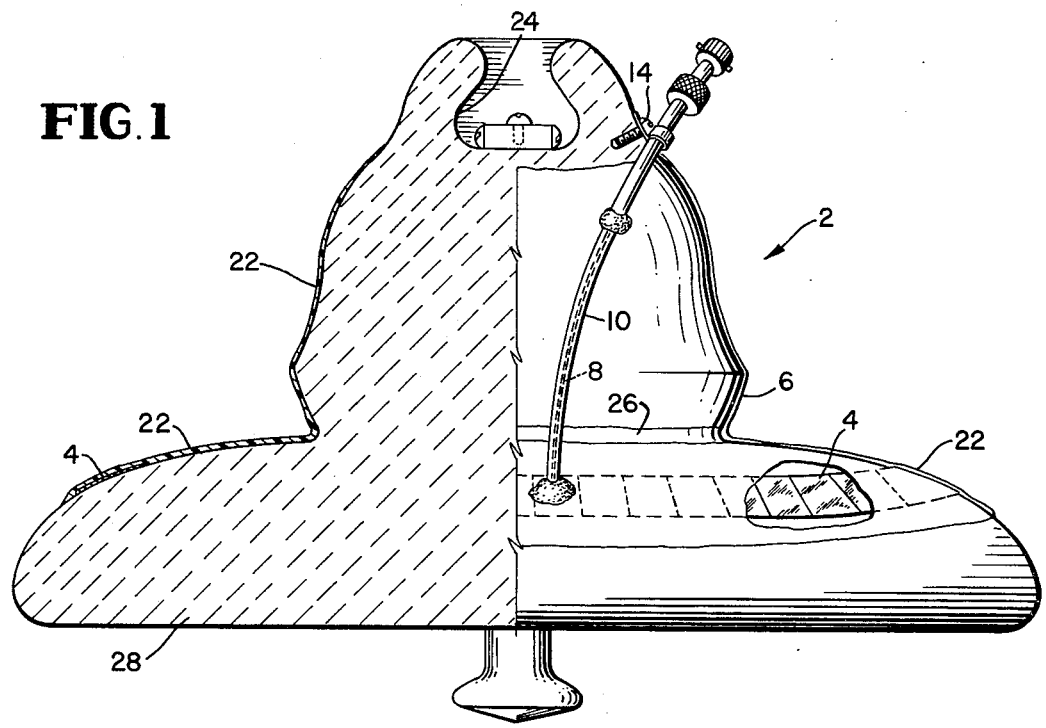
FIG. 1 illustrates one embodiment of a suspension insulator modified for use with the present invention.
Figure 2:
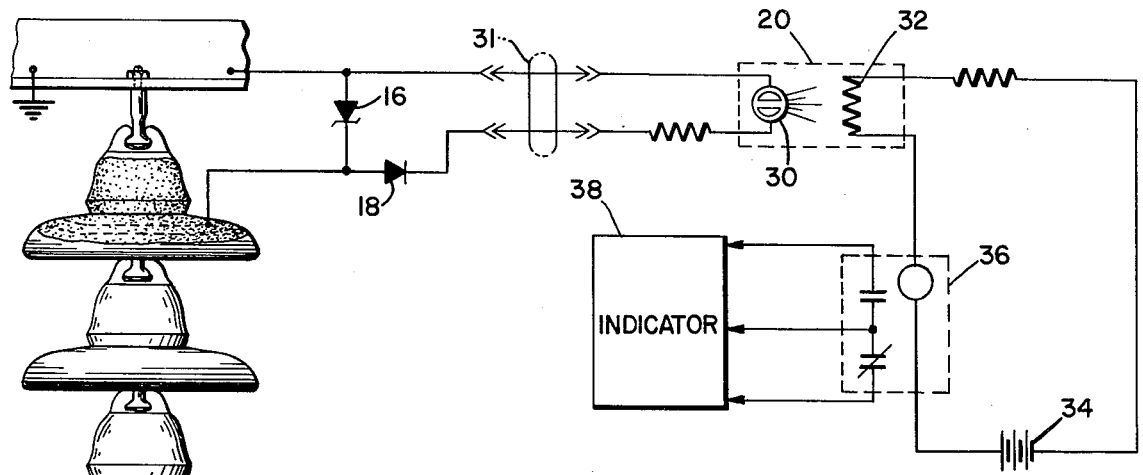
FIG. 2 illustrates several suspension insulators in a suspension insulator string, one insulator being modified as in FIG. 1 for use in a system according to the invention.

In FIG. 1, a standard suspension porcelain insulator 2, modified for use with the present invention, is illustrated. There are a large number of designs of such suspension insulators with which the present invention can be used, and the design illustrated is illustrative only. Insulator 2 is illustrated in a partially sectional view. A capacitative pick-up plate such as ring 4 is constructed of conductive material on the surface of the insulator.

In one embodiment which has been constructed, the pick-up ring is a one-inch wide strip of Scotch brand 3M Copper Foil Tape No. 1245, which has a conductive pressure sensitive adhesive coating. The tape is cut and overlapped to form a circle on the top side of the insulator about 1½ inches from the hub 6.

Figure 3:
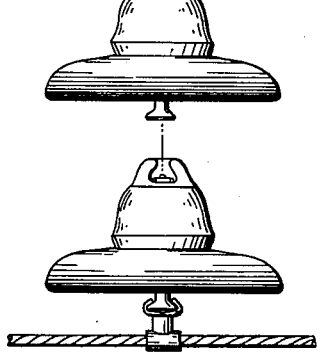
FIG. 3 illustrates in greater detail a connector unit for rectifying and regulating the current picked up from the unit of FIG. 1.

An insulated conductor 8 is soldered to the metal tape 4 and connected to a rectifier-regulator circuit which is housed in a short piece of copper tubing 10 crimped to a BNC connector at 12. This feature is illustrated in greater detail in FIG. 3. The connector is physically and elecrically attached to hub 6 by a bracket 14, which is screwed or bolted to the hub. The hub and therefore the copper tubing are at ground potential. Within the grounded tubing are a regulator (such as a zener diode) 16 and a rectifier 18.

Thus, the current from the pick-up ring is rectified and passed through a shielded or coaxial cable to a photo coupler 20 located in a convenient place near ground level. The rectifier 18 is used to prevent dissipating the small amount of power available in the capacitance of the cable insulation. A coating 22 of insulating epoxy is applied over the copper foil pick-up ring and insulator surface up to the hub 6 and over the hub to just below the hub socket 24 to lengthen the surface leakage path. The ground area 26 where the hub meets the bell-shaped insulator body 28 is filled with silicone rubber cement (RTV) to allow for thermal expansion. This is done to prevent water, dust, and other contaminents from altering the capacitance between the pick-up ring and ground. In addition, the IPD can be coated with insulating silicone grease to encapsulate dirt, or other particles and break up water conductive paths. All circuit connections between the pick-up ring and a neon lamp 30 in photocoupler 20 are sealed against moisture to prevent loss of power to the neon lamp. A coaxial cable 31 with weatherproof connectors at each end connects the structure from the top of the tower with that which is located for convenience at the bottom of the tower.

Within the photocoupler 20 is also a photosensitive element 32, which is electrically isolated from the power line and is in a separate relay circuit which is powered by a d.c. power source 34 such as a battery (130 VDC in the preferred embodiment). Responsive to the illumination of the photosensitive element 32, the power source 34 drives a relay 36 to provide a condition indicating signals to some indicating device 38, the structure of which provides no part of the present invention and is not further illustrated.

Many variations and modifications of the pickup ring and detection circuit will be readily apparent to those skilled in the art. A capacitive pickup plate of various configurations and types can be added to or built into a standard suspension insulator and by using a neon lamp attached to the pickup plate, a continuous indication of an energized/deenergized condition of whatever line or bus the suspension insulator is insulating can be obtained.

The preferred embodiment of the device according to the present invention is similar to the devices of the patents referenced in that it utilizes the capacitive voltage detection principle and also is similar to the units that use the neon light principle for indication of energized conductors. However, it is not limited to use on plastic- or rubber-insulated cables or connectors. It will detect voltages in the range of the insulated cable, but it is specifically designed to be used in conjunction with the higher voltages that use the suspension type procelain insulators. It is to be permanently installed on a power line or high-voltage bus so that indication from the device can be continuously monitored by a dispatcher, a computer or a relay at a remote location. It does not require a hot-stick or other tool to operate the device in order to obtain the information.

Alternate embodiments of the insulator potential detector (IPD) can be devised to post, pin, and suspension-type insulators.

The post and pin-type insulators can be electrically insulated from ground with a thin sheet of micarta, or other suitable insulating material, placed between the insulator base and mounting steel. The holes for the mounting bolts can be slightly enlarged to accommodate the regular bolts with an insulating material on the bolt shank, or the bolt shank can be slightly under-cut to accommodate the insulation. A thin micarta washer can be placed under a flat washer on the mounting bolt to secure the insulator base in place and electrically isolate the base from ground. The base is then suitable as a voltage source on an energized bus or line.

The refined IPD could have the pick-up ring or plate built into the insulator during the manufacturing process. The pick-up plate would consist of conductive glaze or material placed under the surface glaze of the insulator surface. The glaze could be placed on the surface to be used nearest the ground-end, depending on whether the pin-type insulator is used in the suspension or stand-off position. The conductor could be brought out to the surface near the cap or pin for convenience in connecting to the detector circuit. This would make an ideal unit by eliminating the effects of moisture and other atmospheric contaminents on the voltage detection circuit.

An alternate to the suspension insulator would be to electrically insulate the ball or socket of the insulator with an insulating material or "C" washer and use the hub or stem of the "ground-end" insulator as the voltage source for the detection circuit.

What is claimed is:

1. In a suspension insulator system for use on a high-voltage transmission line tower including a string of suspension insulators, a first insulator at a first end of the string being connected to the tower and a second insulator at the other end of the string being connected to the transmission line, the system for detecting the presence of electrical potential on the line comprising:
    a. a capacitive pick-up plate affixed to the first insulator for capacitively picking up an alternating potential from the line and providing a small alternating current, b. a two-conductor connector having one end of a first conductor electrically attached to the pick-up plate for carrying the alternating current and having one end of a second conductor connected to the ground potential of the tower, c. a rectifier in one of the two conductors for changing the alternating current into direct current, d. a photocoupler comprising a lamp and a photosensitive element, the lamp being connected across the two conductors and responsive to the direct current for providing illumination to the photosensitive element, and e. a relay circuit including the photosensitive element and responsive to the illumination of the photosensitive element for providing an indicator signal.

2. A system according to claim 1 further comprising a voltage regulator connected across the two conductors for controlling the size of signal to the lamp.

3. A system according to claim 1 wherein the lamp is a neon lamp.

4. A system according to claim 1 wherein the first suspension insulator is constructed as a bell-shaped insulator body joined to an insulating hub at a grooved area, and wherein a. the capacitive pick-up plate is a ring-shaped conductor affixed to a surface of the bell-shaped insulator body, b. the grooved area is filled with a silicone rubber cement to allow for thermal expansion of the suspension insulator, and c. a coating of insulating epoxy is applied over the pick-up plate up to the hub and over the hub to an area near the hub socket to assist in reducing surface leakage.

5. A system according to claim 1 wherein the two-connector conductor comprises a coaxial conductor, the first conductor being a central conductor and the second conductor being a shielding outer conductor, and further comprising a bracket for mechanically and electrically connecting the outer conductor to the hub of the first insulator near the hub socket, whereby the outer conductor is effectively grounded.

* * * * *